United States Patent [19]

Shel

[11] Patent Number: 5,790,365

[45] Date of Patent: Aug. 4, 1998

[54] METHOD AND APPARATUS FOR RELEASING A WORKPIECE FROM AND ELECTROSTATIC CHUCK

[75] Inventor: Viktor Shel, Milpitas, Calif.

[73] Assignee: Applied Materials, Inc., Santa Clara, Calif.

[21] Appl. No.: 690,086

[22] Filed: Jul. 31, 1996

[51] Int. Cl.⁶ .................................................. H02N 13/00
[52] U.S. Cl. ........................................ 361/234; 279/128
[58] Field of Search .............................. 361/234; 279/128

[56] References Cited

U.S. PATENT DOCUMENTS

| | | | |
|---|---|---|---|
| 3,767,551 | 10/1973 | Lang, Jr. et al. | 204/192 |
| 4,399,016 | 8/1983 | Tsukada et al. | 204/192 |
| 5,117,121 | 5/1992 | Watanabe et al. | 307/130 |
| 5,221,450 | 6/1993 | Hattori et al. | 204/192.32 |
| 5,325,261 | 6/1994 | Horwitz | 361/234 |
| 5,459,632 | 10/1995 | Birang et al. | 361/234 |
| 5,460,684 | 10/1995 | Saeki et al. | 156/345 |
| 5,542,559 | 8/1996 | Kawakami et al. | 216/67 |

FOREIGN PATENT DOCUMENTS 0 439 000 B1   9/1994   European Pat. Off. ........ H02N 13/00

OTHER PUBLICATIONS

Watanabe et al., "Electrostatic Force and Absorption Current of Alumina Electrostatic Chuck", Jpn. J. Appl. Phys., vol. 31, pp. 2145-2150 (1992).

Primary Examiner—Brian K. Young
Assistant Examiner—Thuy-Trang N. Huynh
Attorney, Agent, or Firm—Thomason & Moser

[57] ABSTRACT

An apparatus and concomitant method that applies an oscillating voltage to at least one electrode of an electrostatic chuck. The apparatus is a switching circuit connected between the electrostatic chuck power supply and an electrode or electrodes of an electrostatic chuck. In one contact position, the relay applies the electrostatic chuck chucking voltage to the electrode(s). While in a second contact position, the electrode(s) is connected through an inductor to a predetermined potential, e.g., ground. To dechuck a wafer from the chuck surface, the relay is switched from the first position to the second position connecting the electrode(s) through the inductor to ground. Because the wafer and the chuck electrode(s) form a parallel plate capacitor, this inductor and capacitor combination forms a tank circuit that oscillates at a resonant frequency. As such, energy is transferred between the capacitor and the inductor, and vice versa, in a decaying manner over a period of time that is defined by the Q of the tank circuit. This oscillating energy produces an oscillating voltage across the wafer-to-chuck interface that discharges any residual charge between the wafer and chuck.

9 Claims, 2 Drawing Sheets

METHOD AND APPARATUS FOR RELEASING A WORKPIECE FROM AND ELECTROSTATIC CHUCK

BACKGROUND OF THE DISCLOSURE

1. Field of the Invention

The invention generally relates to electrostatic chucks for holding a workpiece and, more specifically, to methods and apparatus for releasing a workpiece (such as a semiconductor wafer) from an electrostatic chuck.

2. Description of the Background Art

Electrostatic chucks are used for holding a workpiece in various applications ranging from holding a sheet of paper in a computer graphics plotter to holding a semiconductor wafer within a semiconductor fabrication process chamber. Although electrostatic chucks vary in design, they all are based on the principle of applying a voltage to one or more electrodes in the chuck so as to induce opposite polarity charges in the workpiece and electrodes, respectively. The electrostatic attractive force between the oppositely polarized charges pulls the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. Another conventional solution which purportedly removes the charge more quickly is to reverse the polarity of the DC voltage applied to the electrodes. This technique is described in the context of a chuck having two electrodes (a bipolar chuck) in U.S. Pat. No. 5,117,121 issued to Watanabe et al.

A shortcoming that has been observed with these conventional approaches for removing the electric charge is that they fail to completely remove the charge, so that some electrostatic attractive force remains between the workpiece and the chuck. This residual electrostatic force necessitates the use of a large mechanical force to separate the workpiece from the chuck. Furthermore, after many cycles of chucking and dechucking of a plurality of semiconductor wafers, the residual charge accumulates between the wafer and chuck. As such, over time, each wafer becomes more difficult to remove from the chuck surface than the immediately preceding wafer that was processed. When the workpiece is a semiconductor wafer, the force required for removal sometimes cracks or otherwise damages the wafer. Even when the wafer is not damaged, the difficulty in mechanically overcoming the residual electrostatic force sometimes causes the wafer to "pop off" the chuck unpredictably into a position from which the wafer is difficult to retrieve using a conventional wafer transport robot.

Therefore, there is a need in the art for a method and apparatus for dechucking a workpiece from an electrostatic chuck that substantially removes the residual charge.

SUMMARY OF THE INVENTION

The disadvantages heretofore associated with the prior art methods and apparatus of dechucking are overcome by the present invention. The present invention is an apparatus and concomitant method that applies an oscillating voltage to the electrostatic chuck to discharge the residual charge between the wafer and chuck. Specifically, the apparatus contains a relay connected between the electrostatic chuck power supply and an electrode of an electrostatic chuck. In a first contact position, the relay applies a chucking voltage to the electrode(s) of the electrostatic chuck. While in a second contact position, the relay disconnects the power supply from the electrode(s) and connects the electrode(s) through an inductor to ground. In this manner, to dechuck a wafer from the chuck surface, the relay is switched from the first position to the second position connecting the electrode(s) to ground. As such, the residual charge will discharge from the electrode-wafer interface through the inductor to ground. However, since the wafer and chuck electrode form a parallel plate capacitor having the wafer connected to ground through a plasma and the electrode connected to the inductor through the relay, this capacitor in combination with the inductor forms a resonant tank circuit that oscillates at a resonant frequency. As such, energy is transferred in an oscillatory manner between the capacitor and inductor, and vice versa. The current between the capacitor and inductor oscillates in a decaying manner over a period of time. The decay rate is defined by the Q of the tank circuit. This oscillatory energy transfer discharges any residual charge that is trapped between the wafer and the chuck electrode.

More specifically, the method of discharging the residual charge includes the steps of: disconnecting the electrostatic chuck from the chucking voltage; connecting the electrode (or electrodes) of the electrostatic chuck through the inductor to ground; and, shortly after making this connection, disconnecting the power to the plasma within the reaction chamber. The tank circuit oscillates at a resonant frequency and repetitively applies a positive and negative voltage to the wafer and chuck surface interface. Consequently, the charge trapped at the interface dissipates quickly as the tank circuit oscillations decay. Since there is no external energy used to discharge the surface of the electrostatic chuck, the method of the present invention is said to be "self-sweeping".

Empirical evidence indicates that a monopolar chuck retaining a wafer with a chucking voltage of 1200 volts can be discharged in approximately 8 msec. To achieve such rapid discharge a 5.4 mH inductor was used.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
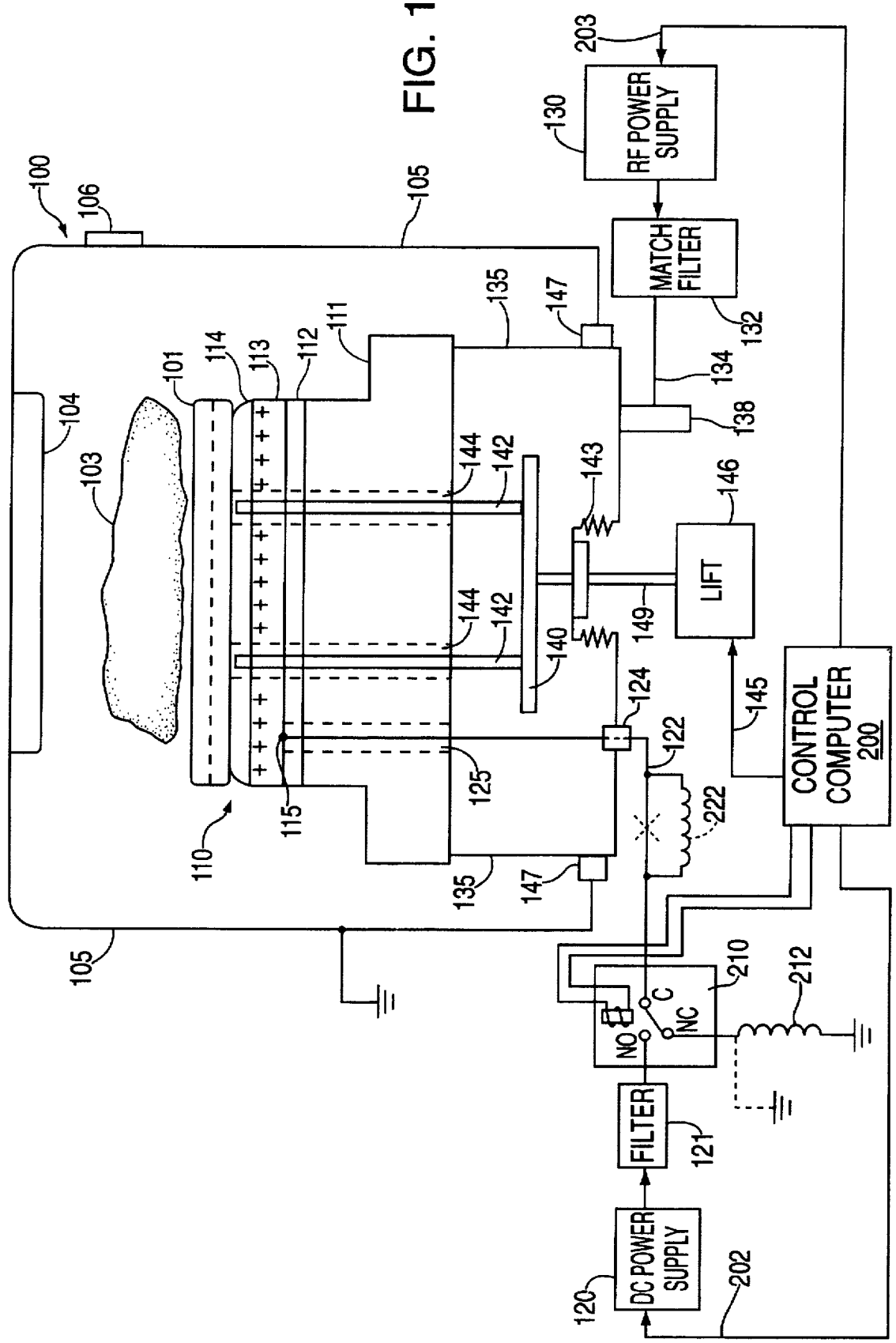
FIG. 1 depicts a schematic drawing of the present invention.

The novel chucking method and apparatus are intended to be used in combination with a conventional electrostatic chuck. As shall be discussed below, the invention finds use with any type of electrostatic chuck, i.e., monopolar, bipolar, semiconducting, ceramic, dielectric, and the like. However, for simplicity, the following discussion focuses upon embodying the invention within a monopolar chuck. FIG. 1 depicts such a monopolar chuck 110 as typically would be configured within a vacuum chamber 100 used for plasma enhanced processing (e.g., etching or chemical vapor deposition) of a semiconductor wafer 101.

The conventional vacuum chamber 100 includes a vacuum tight enclosure 105 which is made of aluminum and is electrically grounded. A disk-shaped anodized aluminum anode electrode 104 is mounted just below the upper wall or lid of the enclosure 105 and is electrically connected to the grounded enclosure. In most chambers, the walls of the grounded enclosure form the anode electrode. Also, in some instances, the enclosure forms the cathode electrode (the powered electrode) while the chuck forms the anode electrode (grounded electrode).

The conventional monopolar electrostatic chuck includes an anodized solid aluminum cathode pedestal 111 having a circular, planar top face; a lower dielectric layer 112 bonded to the top surface of the pedestal; a metal chuck electrode 113 bonded to the top surface of the lower dielectric; and an upper dielectric layer 114 bonded to the top face of the chuck electrode. In the depicted embodiment, each dielectric layer is an approximately 75 micron thick layer of polyimide.

The cathode pedestal 111 is mounted on top of and electrically connected to a hollow anodized aluminum cathode base 135. The cathode base is mounted on the lower wall of enclosure 105 by means of an electrically insulating annular flange 147. Electrical connection to the cathode is made by a copper rod 138 having a threaded end which is screwed into a tapped hole at the bottom of the cathode base 135. A copper clip (not shown) connects the rod 138 to RF transmission line 134, which in turn connects to an RF matching network 132, which in turn connects to RF power supply 130.

Electrical connection to the chuck electrode 113 is made by an insulated wire 122 which is attached to the chuck electrode 113 at point 115. The wire 122 extends downward from the electrode 113 through a bore 125 in the cathode pedestal 111, and then out the bottom of the enclosure 105 through a feed-through insulator 124. The wire 122 connects to a common terminal (C) of a relay 210. The normally open terminal (NO) of the relay connects to an RF blocking low pass filter 121, and in turn, to DC voltage supply 120. The normally closed terminal (NC) of the relay connects to one terminal of an inductor 212. The other terminal of the inductor 212 connects to a predetermined potential (e.g., ground). Alternatively, as show as dashed lines, an inductor 222 can be connected in wire 122, i.e., connected between the common terminal (c) of the relay 210 and the electrode 113. The normally closed terminal of the relay is then connected to the predetermined potential (e.g., ground). Both embodiments function in the same manner to discharge the residual charge from the chuck.

During processing of a semiconductor wafer 101 in the chamber 100, the wafer rests on the upper face of the upper dielectric 114 as shown in FIG. 1. After processing is completed, a robot arm (not shown) removes the wafer from the chamber. To facilitate sliding the blade end of the robot arm under the wafer, several (preferably four, but at least three) lift pins 142 lift the wafer 2 to 5 centimeters about the chuck 110. Each lift pin 142 slides vertically in a corresponding bore 144 in the cathode pedestal 111. All the lift pins 142 are mounted on a carriage 140, which is raised and lower by a pneumatic lift mechanism 146 under control of a programmable digital computer 200. In the illustrated embodiment, the lift pins 142 and carriage 140 are considered inside the cathode base 135 within the vacuum chamber 100, whereas the pneumatic lift mechanism 146 is outside the vacuum chamber. They are mechanically connected by a linkage 149 passing through a bellows 143 which permits vertical movement while maintaining a vacuum seal.

In the conventional operation of the process chamber 100, a robot arm (not shown) moves a wafer 101 into the chamber through a slit valve 106. The robot places the wafer on the tips of lift pins 142, which at this time are elevated by the pneumatic lift mechanism 146 so as to protrude 2 to 5 centimeters above the top of the electrostatic chuck 110. The pneumatic mechanism then lowers the lift pins 142 so that the wafer 101 drops onto the top face of the chuck 110, the wafer's descent time typically is 3 to 10 seconds.

Shortly after the wafer is positioned on the chuck, the plasma gas flows into the chamber, the RF power supply applies RF power to the cathode pedestal, and the plasma is ignited within the space between the wafer 101 and the anode 104. The plasma forms a conductive path from the wafer to ground. However, because of the difference between the mobilities of electrons and positive ions, a DC voltage drop appears across the plasma so that the wafer is negatively biased relative to the grounded enclosure 105. If the chucking voltage applied to the chuck electrode 113 by the DC voltage supply 120 is positive, the total voltage between the wafer and the chuck electrode will be the sum of the wafer bias voltage and the chucking power supply voltage. Thus, the wafer bias increases the electrostatic force retaining the wafer.

After the plasma is excited, the relay 210 is energized to place the relay contacts in the open position. As such, the chuck voltage supply 120 applies a high DC voltage, on the order of plus 1200 volts, to the chuck electrode 113 relative to ground as illustrated on the left side of the graph of FIG. 2. This voltage causes negative and positive charges to accumulate on the facing surfaces of the wafer and chuck electrode, respectively. The amount of charge is proportional to the product of the voltage and the capacitance between the wafer and the chuck electrode. The opposite polarity charges on the wafer and the chuck electrode produce an electrostatic attractive force which pulls the wafer against the upper face of the chuck. The chucking voltage (1200 volts in this example) is set to a value high enough to produce an electrostatic force between the wafer and the chuck adequate to prevent wafer movement during subsequent process steps. The wafer thus retained securely on the chuck is said to be "chucked."

After the wafer is chucked, one or more semiconductor fabrication process steps are performed in the chamber 100, such as deposition or etching of films on the wafer. Additionally, once the wafer is chucked, a backside coolant such as helium can be applied between the wafer and chuck surface to promote heat conduction from the wafer to the pedestal.

After completion of the semiconductor fabrication process steps, the backside coolant is removed and the pneumatic lift mechanism 146 raises the lift pins 142 to raise the wafer above the chuck 110 so that the wafer can be removed from the chamber by a robot. Before the lift pins can raise the wafer, the wafer must be "dechucked"; that is, the electrostatic force retaining the wafer on the chuck 100 must be removed.

Using the present invention, the electrostatic force on the wafer can be essentially eliminated, thereby permitting easy removal of the wafer from the chuck. The method of the present invention applies an oscillating voltage to the wafer chuck interface which, over a short period of time, discharges the residual charge that has accumulated between the wafer and the chuck.

The apparatus of the present invention comprises the relay 210 connected between the electrostatic chuck electrode 113 and the electrostatic chuck power supply 120. The normally closed position (NC) of the relay 210 connects the chuck electrode 113 to ground through the inductor 212. This inductor has an inductance between 1 and 10 mH. The normally open position (NO) of the relay 210 connects the power supply 120 to the electrostatic chuck electrode 113. As such, during chucking of the wafer to the chuck, the relay is positioned in the normally open position such that the power supply is connected to the electrostatic chuck electrode, i.e., the relay coil is powered by the control computer 200 to position the contacts in the normally open position. When dechucking is required, the relay is switched into the normally closed position, i.e., the control computer disconnects power from the relay coil, and the relay connects the chuck electrode 113 to the inductor 212. Initially, when the electrode is connected to the inductor, the plasma remains energized in the chamber, effectively connecting the wafer through the plasma to the top electrode or any grounded surface in the chamber. As such, while the plasma is maintained, the wafer and chuck electrode form a parallel plate capacitor that is connected in parallel with the inductor.

This dechucking apparatus forms an LC tank circuit comprising the inductor 212 and the capacitor formed between the wafer 101 and the chuck electrode 113. The tank circuit has a resonant frequency of $2\pi(LC)^{1/2}$. The voltage within the tank circuit oscillates at the resonant frequency for a period of time that is defined by the Q of the LC circuit. After a short amount of time of oscillation, the computer 200 disables the RF power maintaining the plasma, and the plasma is de-energized. The amount of time for retaining the plasma after disconnecting the chucking voltage from the electrostatic chuck is approximately one second. The duration is defined by the decay time of the tank circuit, e.g., the plasma is discontinued after substantially all the residual charge is removed from the chuck surface.

Because the wafer and the upper dielectric both have, at a microscopic level, imperfectly flat surfaces, the wafer and the dielectric actually contact each other only at thousands of tiny points, leaving thousands of microscopic gaps between the wafer and the dielectric. The chucking voltage between the wafer and the chuck electrode produces a strong electric field across these microscopic gaps. At chucking voltages high enough to securely retain the wafer on the chuck, it is believed this electric field causes electrons to migrate from the wafer to the adjacent surface of the upper dielectric through the physical mechanism of field emission. When the chucking voltage, and hence the electric field, is removed, the electrons accumulated in the dielectric have no discharge path, so they remain in the dielectric. Using the present invention, the electrons are given a discharge path through the inductor, however, because of the parallel plate capacitance of the wafer and chuck electrode combination, the voltage within the inductor-capacitor combination oscillates in a positive and negative manner until the energy within the circuit has been dissipated. This oscillating voltage discharges the residual charge without applying any external voltage to the chuck electrode.

Figure 2:
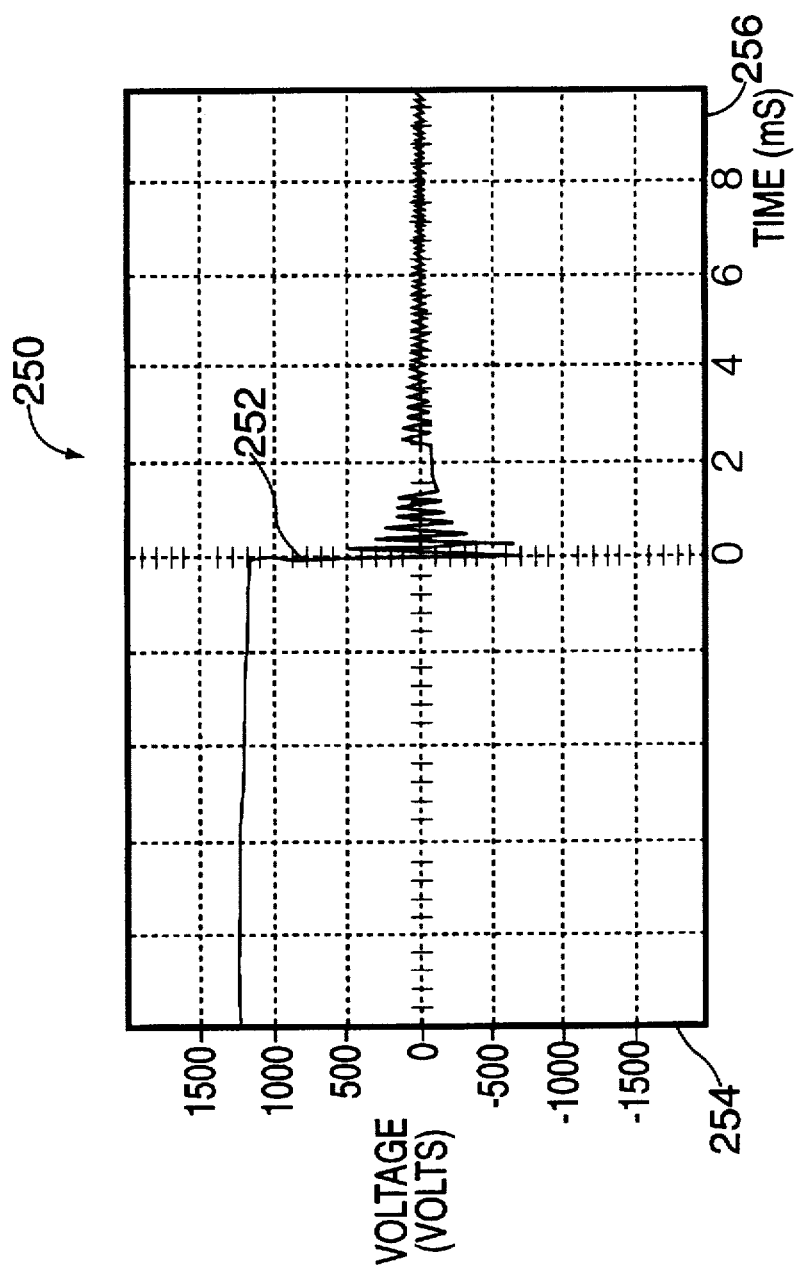
FIG. 2 depicts a graph of the voltage on the chuck electrode as the residual charge is dissipated using the present invention.

FIG. 2 depicts a graph 250 of the oscillating voltage 252 as measured on the electrode of the electrostatic chuck during discharge of the residual charge between the wafer and the electrostatic chuck. The vertical axis 254 represent voltage and the horizontal axis 256 represents time in milliseconds. This data was measured in a Model 5300 high density oxide etch wafer processing system manufactured by Applied Materials, Inc. of Santa Clara, Calif. The discharge inductor had a value of 5.4 mH and the inventive method discussed above was used to dissipate the residual charge between the wafer and chuck. Note that the voltage is discharged from approximately 1,200 volts (the chucking voltage) to 0 volts within approximately 8 milliseconds. The resonant frequency of this exemplary circuit is approximately 5 kHz.

In practice, such a discharge process is accomplished after each wafer is processed within the chamber such that within 8 milliseconds of the end of each process step, the wafer is ready for the lift pins to remove the wafer from the chuck surface and be transferred using the wafer transfer robot. By discharging the wafer and chuck in this manner after processing each wafer, the residual charge does not accumulate as a plurality of wafers are sequentially processed.

The inventive apparatus can be adapted for use in other types of electrostatic chucks such as bipolar chucks by providing a relay and inductor for each electrode of the chuck. As such, during dechucking, a pair of resonant LC circuits are produced to discharge any residual charge between the electrodes and the workpiece.

Also, the foregoing disclosure assumed the chucking voltage is a positive voltage that causes electrons to accumulate on the surface of the chuck. It should be understood that in some applications of electrostatic chucks, for example, ceramic chucks used in high density plasma applications, the chucking voltage is a negative voltage that causes positive charge to accumulate on the surface of the chuck. Although the polarity is reversed, the dechucking apparatus and method are the same as discussed above.

Furthermore, some plasma reactors do not apply RF power to the pedestal or, alternatively, may supplement the RF power applied to the pedestal, by applying RF power to an antenna (coils) that circumscribes the reaction chamber. In such a system, the dechucking method requires maintaining the connection of RF power to the antenna when the chucking voltage is disconnected. As such, the plasma is maintained while the residual charge is removed by the invention.

Lastly, the foregoing disclosure used the plasma within the chamber to form a conductive path from the wafer to ground. However, this path is available only in processing systems that use a plasma. Therefore, in systems that do not use a plasma or systems that require termination of the plasma prior to dechucking, the conductive path can be provided using a physical conductor. For example, a conductive trace can be affixed to the support surface of the electrostatic chuck such that the underside of the wafer contacts the trace. To dechuck the wafer, the trace is connected to ground when the relay is switched to connect the inductor to the electrode. A double pole, double throw relay could be used to accomplish the simultaneous switching function.

Although various embodiments which incorporate the teachings of the present invention have been shown and described in detail herein, those skilled in the art can readily devise many other varied embodiments that still incorporate these teachings.

What is claimed is:

1. Apparatus for releasing a workpiece from an electrostatic chuck, where the electrostatic chuck includes at least one electrode and a support layer located between the electrode and the workpiece, said apparatus comprising:

an inductor; and a switching circuit connected to said inductor, for selectively connecting said electrode to said inductor to discharge any residual charge between said workpiece and said electrostatic chuck through said inductor to a predetermined potential.

2. The apparatus of claim 1 wherein the inductor has a first terminal connected to said predetermined potential and the switching circuit has one terminal connected to the electrode of said electrostatic chuck, and another terminal connected to a second terminal of said inductor, where said switching circuit selectively connects said electrode through said inductor to said predetermined potential.

3. The apparatus of claim 1 wherein the inductor has a first terminal connected to said electrode and said switching circuit has one terminal connected to a second terminal of said inductor and another terminal connected to said predetermined potential, where said switching circuit selectively connects said electrode through said inductor to said predetermined potential.

4. The apparatus of claim 1 wherein said switching circuit is a relay.

5. The apparatus of claim 4 wherein a normally closed position for said relay connects said electrode to said second terminal of said inductor and a normally open position of said relay connects said electrode to a power supply.

6. The apparatus of claim 1 wherein said inductor has an inductance value between 1 and 10 mH.

7. A method of releasing a workpiece from an electrostatic chuck, where said electrostatic chuck contains at least one electrode and a support layer located between the electrode and the workpiece, said method comprising the steps of:

connecting said workpiece to ground via a conductive path;

disconnecting a chucking power supply from said electrode;

connecting said electrode to an inductor; and discharging residual charge between said workpiece and said electrode through said inductor to a predetermined potential.

8. The method of claim 7 wherein said conductive path is a plasma and said method further comprises the step of de-energizing said plasma after said power is disconnected from said electrode.

9. The method of claim 8 wherein said de-energizing step occurs approximately one second after said power is disconnected from said electrode.

* * * * *